(12) United States Patent
Wang et al.

(10) Patent No.: US 11,239,198 B2
(45) Date of Patent: Feb. 1, 2022

(54) CHIP BONDING METHOD AND BONDING DEVICE

(71) Applicant: BOE TECHNOLOGY GROUP CO., LTD., Beijing (CN)

(72) Inventors: Lili Wang, Beijing (CN); Haiwei Sun, Beijing (CN); Zhenxing Tang, Beijing (CN); Feng Qu, Beijing (CN); Jing Liu, Beijing (CN); Chao Liu, Beijing (CN); Chuhang Wang, Beijing (CN); Qiangwei Cui, Beijing (CN); Ke Meng, Beijing (CN); Linhui Gong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/830,834

(22) Filed: Mar. 26, 2020

(65) Prior Publication Data
US 2021/0159208 A1 May 27, 2021

(30) Foreign Application Priority Data
Nov. 21, 2019 (CN) .......................... 201911149939.3

(51) Int. Cl.
*H01L 23/00* (2006.01)
*H01L 25/18* (2006.01)
*H01L 25/00* (2006.01)

(52) U.S. Cl.
CPC .............. *H01L 24/83* (2013.01); *H01L 24/75* (2013.01); *H01L 25/18* (2013.01); *H01L 25/50* (2013.01); *H01L 24/27* (2013.01); *H01L 24/29* (2013.01); *H01L 2224/753* (2013.01); *H01L 2224/75261* (2013.01); *H01L 2224/8302* (2013.01); *H01L 2224/838* (2013.01); *H01L 2224/83048* (2013.01); *H01L 2224/83097* (2013.01); *H01L 2224/83201* (2013.01); *H01L 2224/83224* (2013.01); *H01L 2224/83868* (2013.01); *H01L 2224/83871* (2013.01); *H01L 2224/83874* (2013.01)

(58) Field of Classification Search
CPC ......... H01L 24/27; H01L 24/29; H01L 24/83; H01L 2224/83224; H01L 2224/83868; H01L 2224/83871; H01L 2224/83874
See application file for complete search history.

(56) References Cited

U.S. PATENT DOCUMENTS

2012/0089180 A1* 4/2012 Fathi .......................... C09J 4/00
606/214

* cited by examiner

*Primary Examiner* — David A Zarneke
(74) *Attorney, Agent, or Firm* — Collard & Roe, P.C.

(57) ABSTRACT

A chip bonding method and a bonding device. The chip bonding method is used for bonding a chip to a display module, the display module includes a substrate and a functional layer on the substrate, the substrate includes a first substrate portion and a second substrate portion, the functional layer is on the first substrate portion, and an electrode is on an upper side of the second substrate portion. The chip bonding method includes: forming a light absorbing film layer on a side of the second substrate portion facing away from the electrode; coating a conductive adhesive film on the electrode, and placing the chip on the conductive adhesive film; and irradiating, by using a laser beam, a side of the second substrate portion facing away from the electrode.

17 Claims, 5 Drawing Sheets

CHIP BONDING METHOD AND BONDING DEVICE

CROSS-REFERENCE TO RELATED APPLICATION

The present application claims priority to Chinese Patent Application No. 201911149939.3, filed on Nov. 21, 2019 and entitled "CHIP BONDING METHOD", the disclosure of which is incorporated herein for all purposes by reference in its entirety as part of the present application.

TECHNICAL FIELD

Embodiments of the present disclosure relate to a chip bonding method and a bonding device.

BACKGROUND

A chip of a display device is generally packaged by the COG (chip on glass) technology. Specifically, an electrode is provided on a glass substrate, and the chip is pressed to be electrically connected to the electrode through an anisotropic conductive adhesive coated on the electrode.

SUMMARY

At least one embodiment of the present disclosure provides a chip bonding method for bonding a chip to a display module, the display module comprising a substrate and a functional layer on the substrate, the substrate comprising a first substrate portion and a second substrate portion, the functional layer being on the first substrate portion, and an electrode being on an upper side of the second substrate portion; and the chip bonding method comprising:
forming a light absorbing film layer on a side of the second substrate portion facing away from the electrode;
coating a conductive adhesive film on the electrode, and placing the chip on the conductive adhesive film; and
irradiating, by using a laser beam, a side of the second substrate portion facing away from the electrode.

For example, the chip bonding method according to at least one embodiment of the present disclosure further comprises: pressing the chip toward the electrode to electrically connect the chip to the electrode through the conductive adhesive film.

For example, in the chip bonding method according to at least one embodiment of the present disclosure, the conductive adhesive film comprises an anisotropic conductive adhesive.

For example, in the chip bonding method according to at least one embodiment of the present disclosure, the second substrate portion comprises an electrode area where the electrode is arranged and a peripheral area where the electrode is not arranged, and the light absorbing film layer covers the periphery area and does not cover the electrode area.

For example, in the chip bonding method according to at least one embodiment of the present disclosure, the forming the light absorbing film layer on the side of the second substrate portion facing away from the electrode comprises:
forming a light absorbing material layer on the side of the second substrate portion facing away from the electrode, the light absorbing material layer covering the electrode area and the peripheral area;
patterning the light absorbing material layer, removing the light absorbing material layer covering the electrode area, and keeping the light absorbing material layer covering the peripheral area as the light absorbing film layer.

For example, in the chip bonding method according to at least one embodiment of the present disclosure, the forming the light absorbing film layer on the side of the second substrate portion facing away from the electrode comprises:
attaching a shielding layer on the side of the second substrate portion facing away from the electrode, the shielding layer covering the electrode area;
forming a light absorbing material layer on the side of the second substrate portion facing away from the electrode, the light absorbing material layer covering the shielding layer and the peripheral area; and
removing the shielding layer and the light absorbing material layer covering the shielding layer, and keeping the light absorbing material layer covering the peripheral area as the light absorbing film layer.

For example, in the chip bonding method according to at least one embodiment of the present disclosure, the second substrate portion comprises an electrode area where the electrode is arranged and a peripheral area where the electrode is not arranged, the light absorbing film layer comprises a first light absorbing film layer covering the electrode area and a second light absorbing film layer covering the peripheral area, and the first light absorbing film layer has a higher light transmittance than the second light absorbing film layer.

For example, in the chip bonding method according to at least one embodiment of the present disclosure, the second substrate portion comprises an electrode area where the electrode is arranged and a peripheral area where the electrode is not arranged, the light absorbing film layer covers the electrode area and the peripheral area, a portion of the light absorbing film layer covering the electrode area and a portion of the light absorbing film layer covering the peripheral area has a same light transmittance, and the light transmittance of the light absorbing film layer is higher than 50%.

For example, in the chip bonding method according to at least one embodiment of the present disclosure, the irradiating, by the laser beam, the side of the second substrate portion facing away from the electrode comprises:
irradiating the electrode area by using a first sub-laser beam and irradiating the peripheral area by using a second sub-laser beam, wherein the first sub-laser beam has a higher intensity than the second sub-laser beam.

For example, in the chip bonding method according to at least one embodiment of the present disclosure, a projection of the laser beam on the substrate covers the second substrate portion.

For example, in at least one embodiment of the present disclosure, subsequent to forming the light absorbing film layer on the side of the second substrate portion facing away from the electrode, the chip bonding method further comprises:
placing the display module on a support, wherein the support is on a side of the display module where the light absorption film layer is formed, and the laser beam is capable of passing through the support.

For example, in the chip bonding method according to at least one embodiment of the present disclosure, the support is at least partially transparent.

For example, in the chip bonding method according to at least one embodiment of the present disclosure, the support comprises quartz.

For example, in the chip bonding method according to at least one embodiment of the present disclosure, the irradiating, by using the laser beam, the side of the second substrate portion facing away from the electrode comprises: generating the laser beam by an infrared laser.

For example, in the chip bonding method according to at least one embodiment of the present disclosure, a material of the light absorbing film layer comprises a photoresist.

For example, in the chip bonding method according to at least one embodiment of the present disclosure, the substrate comprises a glass substrate.

For example, in the chip bonding method according to at least one embodiment of the present disclosure, the irradiating, by using the laser beam, the side of the second substrate portion facing away from the electrode comprises: causing a part of the laser beam to be absorbed by the light absorbing film layer, and causing another part of the laser beam to pass through the substrate to heat the conductive adhesive film.

At least one embodiment of the present disclosure further provides a bonding device, which includes:

a support, configured to support a substrate;

a laser, configured to provide a laser beam to irradiate a side of the substrate supported by the support; and a pressing device, comprising a movable end configured to press the substrate toward the support;

wherein the support is configured to allow at least a part of the laser beam to pass through.

For example, in the bonding device according to at least one embodiment of the present disclosure, the support comprises quartz.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
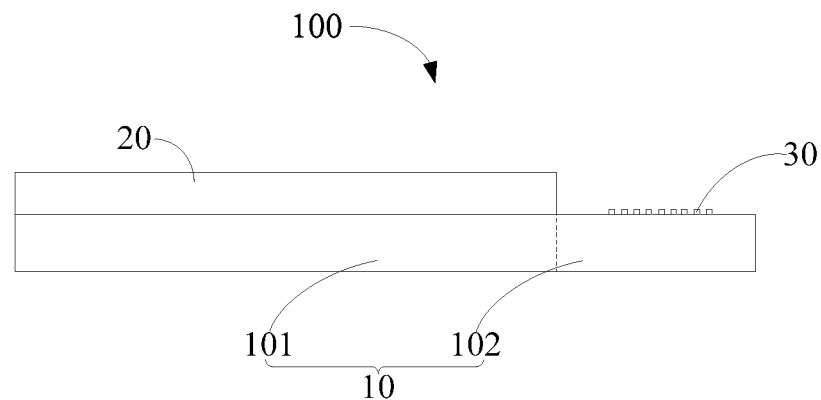
FIG. 1 is a cross-sectional view of a display module according to at least one exemplary embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for convenience of description, a direction from a substrate to a functional layer is defined as an upward direction, and a direction from the functional layer to the substrate is defined as a downward direction, so as to determine the upward direction and the downward direction. It is easy to understand that different direction definitions will not affect the substantial operations of the process and the actual configuration of the product.

The inventors of the present disclosure have noted that during the process of bonding a chip to a glass substrate using the COG technology, due to different thermal expansion coefficients of the chip and of the substrate, a problem of warping and deformation of the glass substrate and the chip may occur, and the warping and deformation of the glass substrate may extend to the display area, causing light leakage in the portion of the display area adjacent to the chip, and the COG Mura phenomenon occurs in the display panel (the phenomenon that the display brightness and color of the display panel change due to chip bonding), thereby affecting the display effect of the display panel.

At least one embodiment of the present disclosure provides a chip bonding method. The chip bonding method is used to bond a chip (Integrated Circuit, IC) to a display module.

Referring to FIG. 1, the display module 100 includes a substrate 10 and a functional layer 20 on the substrate 10. The substrate 10 includes a first substrate portion 101 and a second substrate portion 102. The first substrate portion 101 and the second substrate portion 102 refer to different portions of the same substrate. The functional layer 20 is located on the first substrate portion 101, and an electrode 30 is disposed on an upper side of the second substrate portion 102. The electrode 30 is used for electrically connecting with the chip to realize bonding of the chip.

In an embodiment, the functional layer 20 on the substrate 10 may include a pixel circuit layer and a pixel layer on the pixel circuit layer. The pixel circuit layer includes a plurality of pixel circuits, and the pixel layer includes a plurality of pixels. Each pixel circuit is used to drive one pixel, thereby forming a pixel unit, and each pixel emits light of a basic color. The electrode 30 may be formed in the same process step as the pixel circuit. The electrode 30 may be electrically connected to the pixel circuit of the pixel circuit layer through a wire, so that the chip and the pixel circuit layer may be in signal connection with each other.

Figure 2:
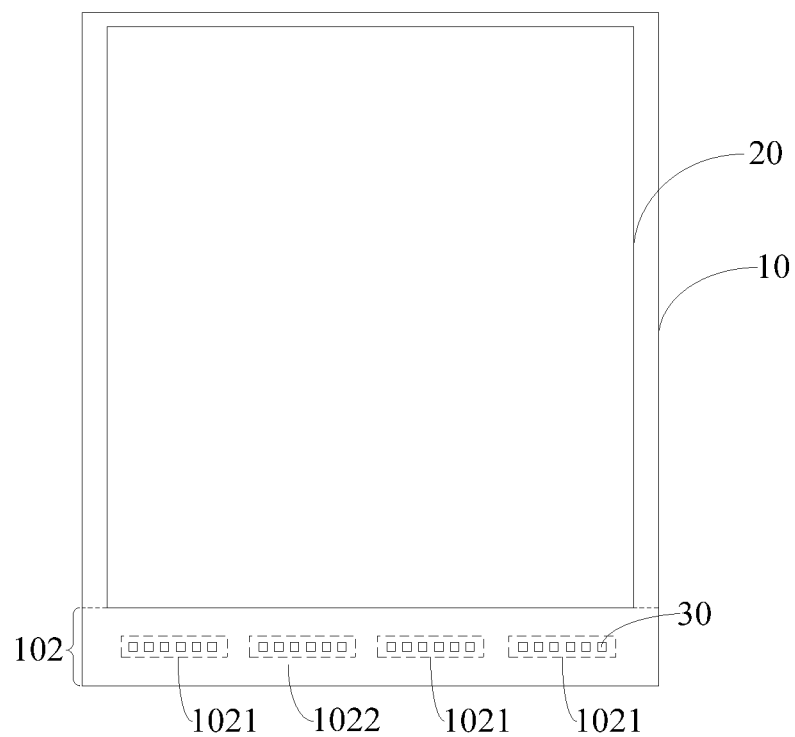
FIG. 2 is a top view of a display module according to at least one exemplary embodiment of the present disclosure.

Referring to FIG. 2, the display module 100 may include a display area and a bezel area, the functional layer 20 is located in the display area, and the second substrate portion 102 is located in the bezel area of the display module 100. Specifically, the second substrate portion 102 may be located at a lower bezel of the display module 100. The second substrate portion 102 may include an electrode area 1021 and a peripheral area 1022. The electrode 30 is disposed in the electrode area 1021. The peripheral area 1022 refers to an area of the second substrate portion 102 excluding the electrode area 1021. When a plurality of chips are to be bonded to the display module 100, the second substrate portion 102 may include a plurality of electrode areas 1021, and each chip corresponds to one electrode area 1021.

It could be understood that although FIG. 2 only shows that the second substrate portion 102 is located on the lower side of the first substrate portion 101, that is, FIG. 2 shows only that the second substrate portion 102 is located on one side of the first substrate portion 101, however, in other embodiments, according to actual requirements, the second substrate portion 102 may be located on more than one side of the first substrate portion 101, for example, the second substrate portion 102 may be located on the upper and lower sides of the first substrate portion 101, and the second substrate portion 102 may be located on the upper side, the lower side, the left side, and the right side of the first substrate portion 101, and the embodiments of the present disclosure are not limited thereto.

Figure 3:
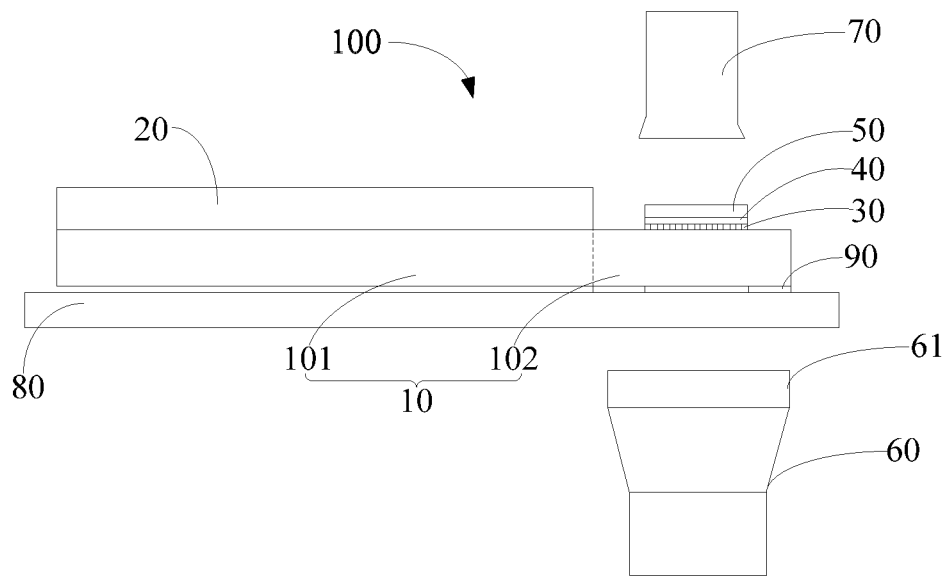
FIG. 3 is a schematic diagram illustrating a position relationship between a display module, a pressing head, and a laser during chip bonding according to at least one exemplary embodiment of the present disclosure.

Referring to FIG. 3, to bond the chip 50 to the substrate 10, an anisotropic conductive film (ACF) 40 is coated on the electrode 30. Particles of the anisotropic conductive film 40 rupture under the action of pressure and/or temperature, to make the chip 50 and the electrode 30 electrically connected. It should be understood that the anisotropic conductive adhesive is only an example. In other embodiments, other types of conductive adhesive may be used according to actual requirements, which is not limited in the embodiments of the present disclosure.

It should be understood that the embodiments of the present disclosure do not limit the type of the chip. For example, the chip may be a gate driving circuit chip, a data driving circuit chip, a touch control chip, or the like.

For ease of description, the chip bonding method provided by the embodiment of the present disclosure requires a laser 60 and a pressing head 70. For example, the laser 60 is located below the substrate 10, and the laser 60 may emit a laser beam 61 to heat the substrate 10 and the chip 50. For example, the pressing head 70 is located above the chip 50, and the pressing head 70 applies pressure to the chip 50.

However, it should be understood that the laser 60 is not limited to being located below the substrate 10, the laser 60 may be located at other positions, and the laser beam may be transmitted to a side of the second substrate portion 102 facing away from the electrode 30 through an optical system including a light transmitting element such as a reflecting mirror or an optical fiber. In addition, in other embodiments, the laser 60 and the pressing head 70 may not be required, but other suitable methods may be used to provide the laser beam and apply pressure to the chip, which is not limited in the embodiments of the present disclosure.

Figure 4:
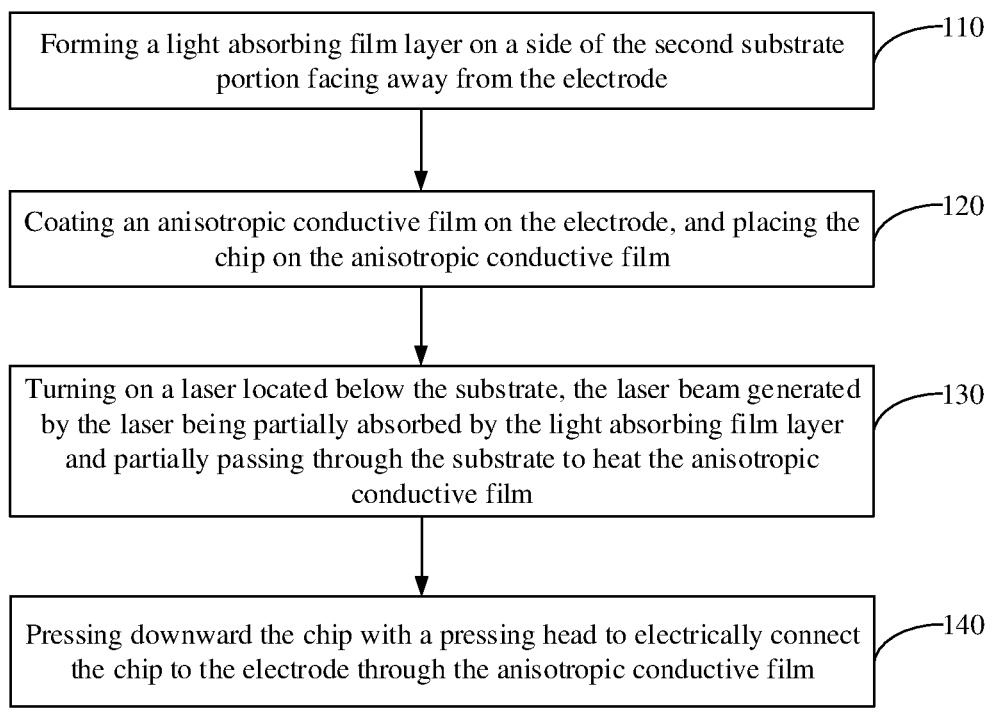
FIG. 4 is a flow chart illustrating a chip bonding method according to at least one exemplary embodiment of the present disclosure.

Referring to FIG. 4, a chip bonding method according to an embodiment of the present disclosure includes the following steps 110 to 140.

At step 110, a light absorbing film layer is formed on a side of the second substrate portion facing away from the electrode.

In some embodiments, after step 110, the chip bonding method may further include: placing the display module 100 on a support 80. The support 80 is used to support the display module 100.

In some technical solutions, during chip bonding, the pressing head above the chip is heated, the pressing head transfers heat to the chip, and the chip transfers part of the heat to the anisotropic conductive film. Meanwhile, a heating component provided on a side of the support heats the support, and the support transfers heat to the substrate. In order to avoid contact between the pressing head and the functional layer which would cause damage to the functional layer, it is necessary to ensure a certain distance between the chip and the functional layer, which is not beneficial to realization of a narrow bezel design of the display device. In addition, since the heating component heats the support and the support transfers heat to the substrate to heat the substrate, there is a hysteresis in the temperature change of the substrate, and the temperature of the substrate is not easy to be controlled. Therefore, the temperature difference between the chip and the substrate is not easy to be controlled, which may cause inconsistent deformations of the chip and the substrate, and cause a problem of warping and deformation of the chip and the substrate after chip bonding is completed.

In the embodiments of the present disclosure, by forming a light absorbing film layer 90 on the side of the second substrate portion 102 facing away from the electrode 30, the laser beam 61 emitted by the laser 60, when passing through the light absorbing film layer 90, is partially absorbed by the light absorbing film layer 90, and the remaining part passes through the substrate 10. The laser beam 61 absorbed by the light absorbing film layer 90 heats the substrate 10 and raises the temperature of the substrate 10. The laser beam 61 passing through the substrate 10 heats the anisotropic conductive film 40, and the anisotropic conductive film 40 transfers part of the heat to the chip 50 to raise the temperature of the chip 50. It can be seen that in the embodiment of the present disclosure, the chip 50 and the substrate 10 may be heated by the laser beam 61, without the need to heat the pressing head 70. When the pressing head 70 presses the chip 50, the chip 50 will not be damaged due to a high temperature, and the pressing head 70 may be prevented from damaging the functional layer 20, so that the distance between the chip 50 and the functional layer 20 may be smaller, which is beneficial to achieving a narrow bezel of the display device. In addition, by controlling an absorbance of the light absorbing film layer 90, the amount of the laser beam 61 that is absorbed by the light absorbing film layer 90 and the amount of the laser beam 61 that passes through the substrate 10 may be controlled, so that the temperature difference between the substrate 10 and the chip 50 may be controlled in an appropriate range, to make the deformations of the substrate 10 and the chip 50 be the same or have a small difference. It may avoid the problem of warping and deformation of the substrate 10 and the chip 50 due to the large difference between the deformations of substrate 10 and chip 50, and may alleviate the COG Mura phenomenon.

In an embodiment, the substrate 10 may be a glass substrate. The glass substrate has a high transmittance to laser light, and a portion of the laser which is not absorbed by the light absorbing film layer 90 may pass through the glass substrate.

Figure 5A:
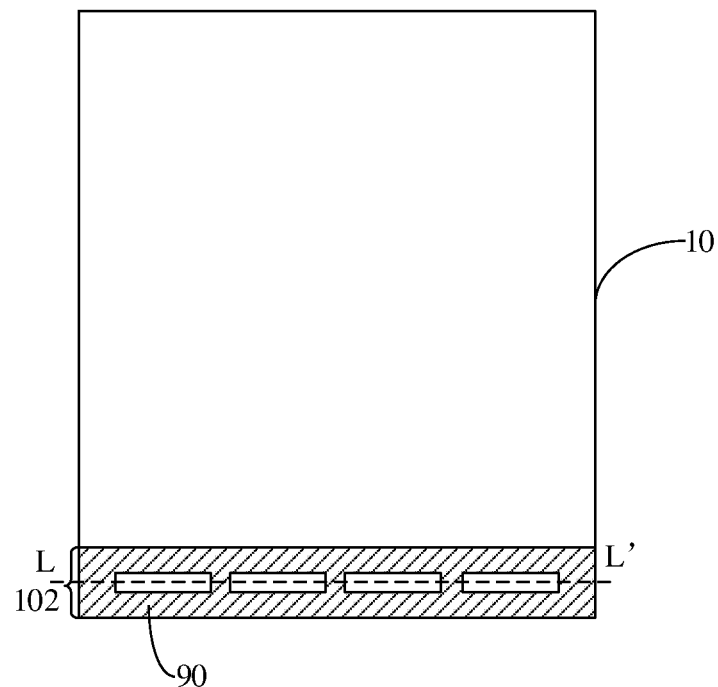
FIG. 5A is a schematic diagram illustrating forming a light absorbing film layer on a display module according to at least one exemplary embodiment of the present disclosure.
Figure 5B:
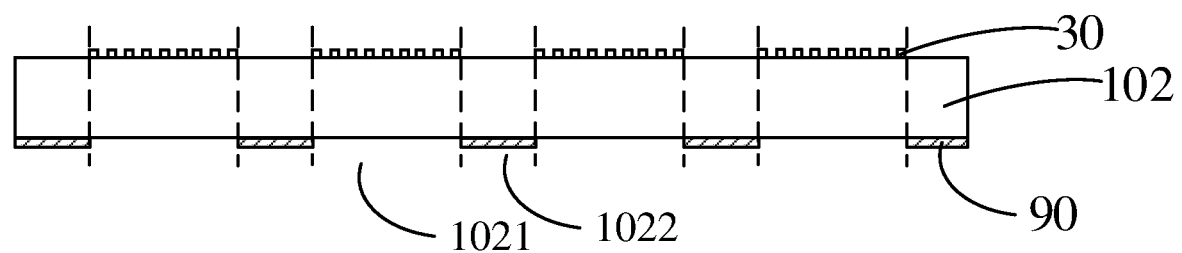
FIG. 5B is a cross-sectional view taken along line L-L' in FIG. 5A.

In an embodiment, referring to FIGS. 5A and 5B, the light absorbing film layer 90 covers the peripheral area 1022 of the second substrate portion 102 and does not cover the electrode area 1021 of the second substrate portion 102. The light absorbing film layer 90 covering the peripheral area 1022 refers to a projection area of the light absorbing film layer 90 on the surface of the second substrate portion 102 on which the electrode 30 is provided and a projection area of the peripheral area 1022 on the surface of the second substrate portion 102 on which the electrode 30 is provided have the same shape and size. That is, the peripheral area 1022 is entirely covered by the light absorbing film layer 90.

In this way, the amount of the laser beam 61 emitted by the laser 60 in the vertical direction has a larger part passing through the electrode area 1021 at a portion corresponding to the electrode area 1021, and the efficiency of heating the anisotropic conductive film 40 may be higher. The anisotropic conductive film 40 may pass more heat to the chip 50 and make the temperature of the chip 50 higher, which may facilitate the bonding of the chip 50.

In an exemplary embodiment, the step 110 of forming the light absorbing film layer on the side of the second substrate portion facing away from the electrode may be implemented by the following steps 111 and 112.

At step 111, a light absorbing material layer is formed on a side of the second substrate portion facing away from the electrode, and the light absorbing material layer covers the electrode area and the peripheral area.

At this step, the light absorbing material layer may be formed on the side of the second substrate portion 102 facing away from the electrode 30 by coating or adhering.

At step 112, the light absorbing material layer is patterned, and the light absorbing material layer covering the electrode area is removed.

At this step, a portion of the light absorbing material layer covering the electrode area 1021 may be removed by an exposure and development process or a laser etching process. The portion of the light absorbing material layer covering the peripheral area 1022, that is, the light absorbing film layer 90, is kept.

In another exemplary embodiment, the step 110 of forming the light absorbing film on the side of the second substrate portion facing away from the electrode may be implemented by the following steps 113 to 115.

At step 113, a shielding layer is attached on a side of the second substrate portion facing away from the electrode, and the shielding layer covers the electrode area.

At step 114, a light absorbing material layer is formed on the side of the second substrate portion facing away from the electrode, and the light absorbing material layer covers the shielding layer and the peripheral area.

A light absorbing material layer may be formed on the side of the second substrate portion 102 facing away from the electrode 30 by coating or adhering.

At step 115, the shielding layer is removed.

At this step, the light absorbing material layer covering the electrode area 1021 is also removed during the process of removing the shielding layer, so that the formed light absorbing film layer does not cover the electrode area 1021.

The shielding layer may be a film layer made of paper or a film layer made of plastic, as long as the shielding layer is easy to be adhered and easy to be removed.

Figure 6A:
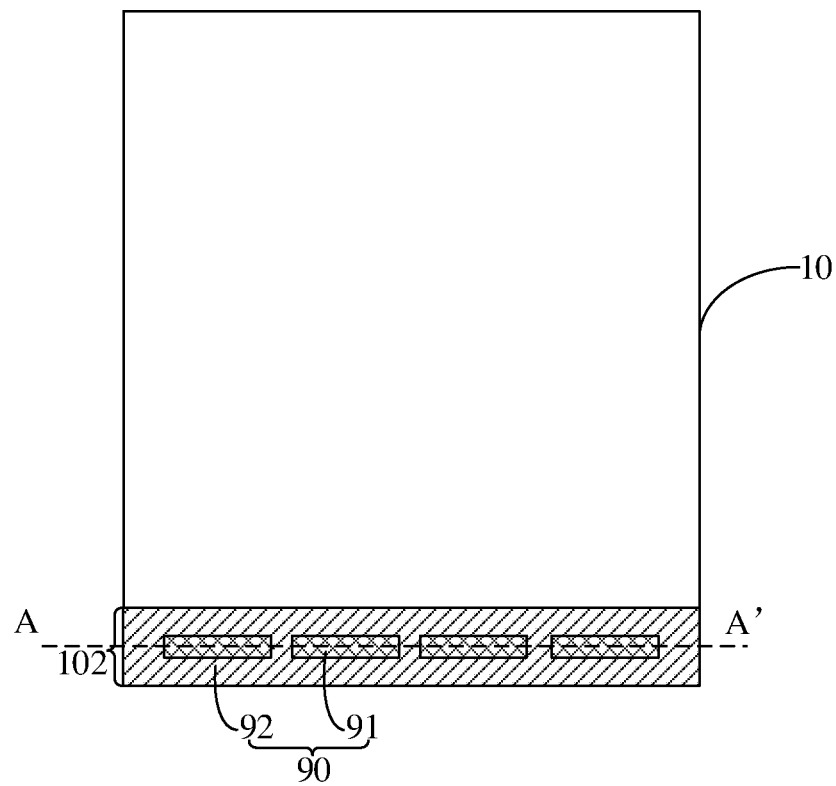
FIG. 6A is another schematic diagram illustrating forming a light absorbing film layer on a display module according to at least one exemplary embodiment of the present disclosure.
Figure 6B:
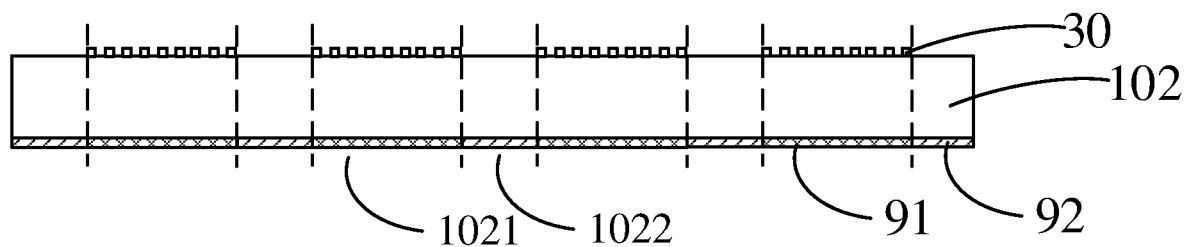
FIG. 6B is a cross-sectional view taken along line A-A' in FIG. 6A.

In another embodiment, referring to FIGS. 6A and 6B, the light absorbing film layer 90 includes a first light absorbing film layer 91 covering the electrode area 1021 and a second light absorbing film layer 92 covering the peripheral area 1022. The light transmittance of the first light absorbing film layer 91 is larger than the light transmittance of the second light absorbing film layer 92.

For example, as shown in FIG. 6B, the area of the orthographic projection of the first light absorbing film layer 91 on the surface of the second substrate portion 102 where the electrode 30 is provided may be the same as the area of the electrode area 1021. For example, a sum of the area of the orthographic projection of the first light absorbing film layer 91 on the surface of the second substrate portion 102 on which the electrode 30 is provided and the area of the orthographic projection of the second light absorbing film 92 on the surface of the second substrate portion 102 on which the electrode 30 is provided may be equal to the area of the surface of the second substrate portion 102 on which the electrode 30 is provided.

In this way, the laser beam 61 may have a smaller part being absorbed when passing through the first light absorbing film layer 91, and have a larger part being absorbed when passing through the second light absorbing film 92, so that the anisotropic conductive film 40 and the chip 50 have higher temperature, which may facilitate the bonding of chip 50. By selecting the first light absorbing film layer 91 and the second light absorbing film layer 92 with appropriate light transmittances, the temperature difference between the substrate 10 and the chip 50 may be controlled in an appropriate range, so that the deformations of the substrate 10 and the chip 50 are the same or have a small difference. For example, a ratio between the light transmittance of the first light absorbing film layer 91 and the light transmittance of the second light absorbing film layer 92 may be 1.1:1, 1.2:1, 1.5:1, 1.6:1, 1.8:1, 2:1 and so on.

When fabricating the light absorbing film layer 90, a first light absorbing film layer 91 may be fabricated first, and then a second light absorbing film layer 92 may be fabricated. Alternatively, the second light absorbing film layer 92 may be fabricated first, and then the first light absorbing film layer 91 may be fabricated.

Figure 7:
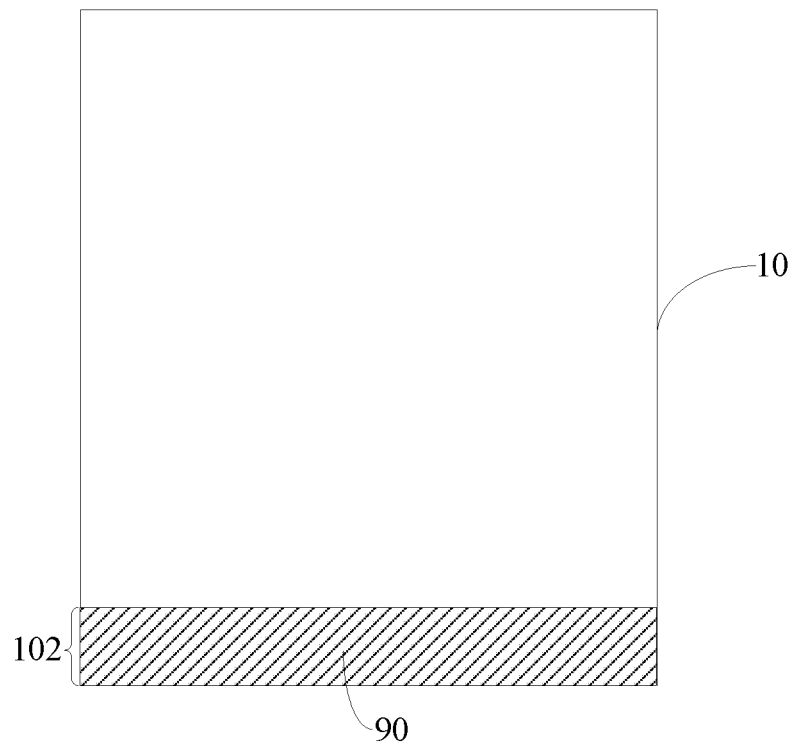
FIG. 7 is another schematic diagram illustrating forming a light absorbing film layer on a display module according to at least one exemplary embodiment of the present disclosure.

In yet another embodiment, referring to FIG. 7, the light absorption film layer 90 covers the electrode area 1021 and the peripheral area 1022, and the portion of the light absorption film layer 90 covering the electrode area 1021 and the portion of the light absorption film layer 90 covering the peripheral area 1022 have the same light transmittance, and the light transmittance of the light absorbing film layer is larger than 50%, for example, 55%, 60%, 65%, 70%, 75%, 80%, 85%, 90%, 95% and so on. In this way, the amount of the laser beam 61 absorbed by the light absorbing film layer 90 may be made smaller, and the amount of the light passing through the light absorbing film layer 90 may be made larger. The temperature of the anisotropic conductive film 40 and the chip 50 may be higher, which may facilitate the bonding of the chip 50. In addition, since the light transmittance of the light absorbing film layer 90 is the same everywhere, the light absorbing film layer 90 may be formed in one process, and the fabrication may be relatively simple.

In the embodiment shown in FIG. 7, a first sub-laser beam and a second sub-laser beam may be used to respectively irradiate the electrode area 1021 and the peripheral area 1022. The intensity of the first sub-laser beam may be higher than that of the second sub-laser beam, so that the part of the light absorbing film layer 90 covering the electrode area 1021 absorbs more laser beams than the part of the light absorbing film layer 90 covering the peripheral area 1022, and the temperature at the electrode area 1021 may be higher than that that at the peripheral area 1022, which facilitates the bonding of the chip 50. In addition, by controlling the intensities of the first sub-laser beam and the second sub-laser beam, the temperature difference between the substrate 10 and the chip 50 may be controlled in an appropriate range, so that the deformations of the substrate 10 and the chip 50 may be the same or have a small difference.

At step 120, an anisotropic conductive film is coated on the electrode, and the chip is placed on the anisotropic conductive film.

At step 130, a laser located below the substrate is turned on. The laser beam generated by the laser is partially absorbed by the light absorbing film layer, and partially passes through the substrate to heat the anisotropic conductive film. It could be understood that the above step 130 is only an exemplary implementation of irradiating the side of the second substrate portion facing away from the electrode by the laser beam, and the embodiments of the present disclosure are not limited thereto.

In an embodiment, the projection of the laser beam 61 generated by the laser 60 on the substrate 10 covers the electrode area 1021 and the peripheral area 1022. In this way, when a plurality of chips 50 are to be bonded, the laser beam 61 may heat all of the plurality of chips 50 and the degrees of heating are approximately the same, which may facilitate the bonding of the chips 50.

In an embodiment, the laser 60 is an infrared laser, and the support 80 is made of a transparent material. The support 80 is made of an at least partially transparent material, and the transmittance of the support 80 to the infrared light emitted from the laser 60 is high, so that the utilization of the laser beam 61 is high. For example, the support 80 may be made of a transparent material. For example, the support 80 may be formed of quartz. However, in other embodiments, the support 80 may also be made of other suitable rigid materials, which is not limited in the embodiments of the present disclosure. Depending on the material of the light absorbing film, the laser 60 may also be other types of lasers, which are not limited in the embodiments of the present disclosure.

At step 140, the chip is pressed downward with a pressing head, so that the chip is electrically connected to the electrode through the anisotropic conductive film. It could be understood that step 140 is only an exemplary implementation of pressing the chip 50 toward the electrode 30, and the embodiments of the present disclosure are not limited thereto.

After the temperature of the anisotropic conductive film 40 raises, the anisotropic conductive film 40 exhibits certain fluidity. The chip 50 is pressed by the pressing head 70, and the pressure applied to the chip 50 by the pressing head 70 is transferred to the anisotropic conductive film 40, particles of the anisotropic conductive film 40 rupture, to make the chip 50 and the electrode 30 be electrically connected.

In an embodiment, the material of the light absorbing film layer 90 may include a photoresist. By selecting photoresists of different colors and different compositions, the transmittance of the light absorbing film layer 90 to the laser beam 61 may be adjusted.

Figure 8:
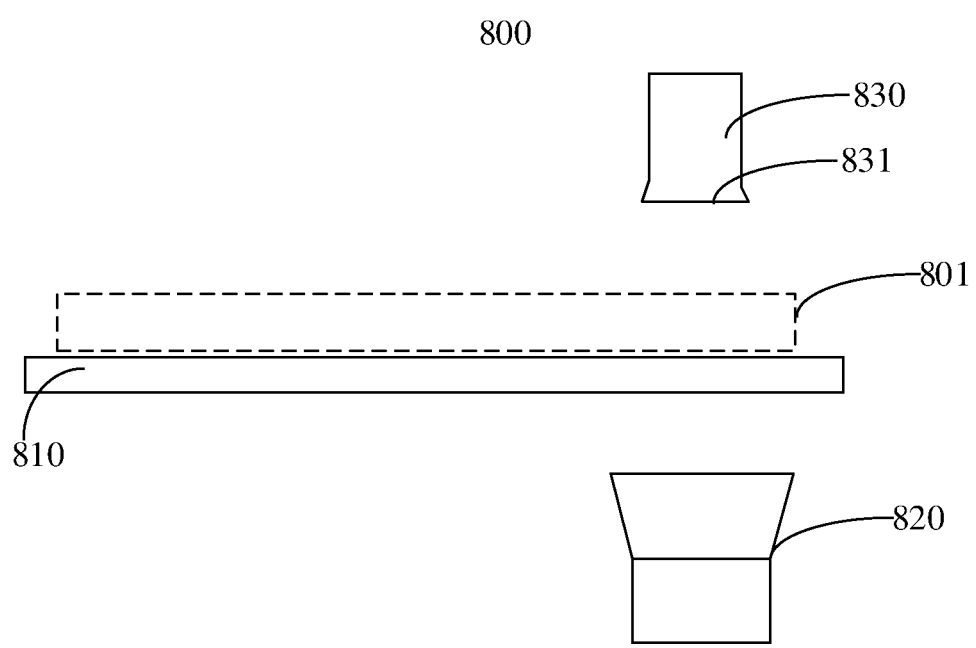
FIG. 8 is a schematic structural diagram illustrating a bonding device according to at least one embodiment of the present disclosure.

FIG. 8 is a schematic block diagram illustrating a bonding device according to at least one embodiment of the present disclosure. The bonding device is adapted to implement the chip bonding method according to any embodiment of the present disclosure. As shown in FIG. 8, the bonding device 800 according to at least one embodiment of the present disclosure may include a support 810 and a laser 820.

The support 810 is configured to support an object. For ease of description, an object 801 is also shown in FIG. 8, but it could be understood that the bonding device 800 does not include the object 801.

The support 810 is, for example, the support 80 described above, and the object 801 is, for example, the substrate of the display module described in any of the above embodiments. For a detailed description of the support 810, reference can be made to the description of the above embodiment, and details will not be described herein again.

The laser 820 is configured to provide a laser beam to irradiate a side of the object supported by the support 810.

The laser 820 is, for example, the laser 60 described above. For example, the laser 820 may be an infrared laser. In FIG. 8, the arrangement of the laser 820 under the support 810 is merely exemplary. It could be understood that the bonding device 800 may further include a light transmission element for transmitting light, so that the laser 820 may be disposed at any suitable position, and the laser beam generated by the laser 820 may be transmitted through the light transmission element to irradiate the side of the object supported by the support 810.

For example, the bonding device 800 may further include a pressing device 830 including a movable end 831. The movable end 831 is configured to press an object toward the support 810. The pressing device 830 is, for example, the pressing head 70 described above.

What are described above is related to the illustrative embodiments of the disclosure only and not limitative to the scope of the disclosure; the scopes of the disclosure are defined by the accompanying claims.

What is claimed is:

1. A chip bonding method for bonding a chip to a display module, the display module comprising a substrate and a functional layer on the substrate, the substrate comprising a first substrate portion and a second substrate portion, the functional layer being on the first substrate portion, and an electrode being on an upper side of the second substrate portion; and the chip bonding method comprising:
   forming a light absorbing film layer on a side of the second substrate portion facing away from the electrode;
   coating a conductive adhesive film on the electrode, and placing the chip on the conductive adhesive film; and
   irradiating, by using a laser beam, a side of the second substrate portion facing away from the electrode.

2. The chip bonding method according to claim 1, further comprising: pressing the chip toward the electrode to electrically connect the chip to the electrode through the conductive adhesive film.

3. The chip bonding method according to claim 1, wherein the conductive adhesive film comprises an anisotropic conductive adhesive.

4. The chip bonding method according to claim 1, wherein the second substrate portion comprises an electrode area where the electrode is arranged and a peripheral area where the electrode is not arranged, and the light absorbing film layer covers the periphery area and does not cover the electrode area.

5. The chip bonding method according to claim 4, wherein the forming the light absorbing film layer on the side of the second substrate portion facing away from the electrode comprises:
forming a light absorbing material layer on the side of the second substrate portion facing away from the electrode, the light absorbing material layer covering the electrode area and the peripheral area; and
patterning the light absorbing material layer, removing the light absorbing material layer covering the electrode area, and keeping the light absorbing material layer covering the peripheral area as the light absorbing film layer.

6. The chip bonding method according to claim 4, wherein the forming the light absorbing film layer on the side of the second substrate portion facing away from the electrode comprises:
attaching a shielding layer on the side of the second substrate portion facing away from the electrode, the shielding layer covering the electrode area;
forming a light absorbing material layer on the side of the second substrate portion facing away from the electrode, the light absorbing material layer covering the shielding layer and the peripheral area; and
removing the shielding layer and the light absorbing material layer covering the shielding layer, and keeping the light absorbing material layer covering the peripheral area as the light absorbing film layer.

7. The chip bonding method according to claim 1, wherein the second substrate portion comprises an electrode area where the electrode is arranged and a peripheral area where the electrode is not arranged, the light absorbing film layer comprises a first light absorbing film layer covering the electrode area and a second light absorbing film layer covering the peripheral area, and the first light absorbing film layer has a higher light transmittance than the second light absorbing film layer.

8. The chip bonding method according to claim 1, wherein the second substrate portion comprises an electrode area where the electrode is arranged and a peripheral area where the electrode is not arranged, the light absorbing film layer covers the electrode area and the peripheral area, a portion of the light absorbing film layer covering the electrode area and a portion of the light absorbing film layer covering the peripheral area has a same light transmittance, and the light transmittance of the light absorbing film layer is higher than 50%.

9. The chip bonding method according to claim 8, wherein the irradiating, by the laser beam, the side of the second substrate portion facing away from the electrode comprises:
irradiating the electrode area by using a first sub-laser beam and irradiating the peripheral area by using a second sub-laser beam, wherein the first sub-laser beam has a higher intensity than the second sub-laser beam.

10. The chip bonding method according to claim 1, wherein a projection of the laser beam on the substrate covers the second substrate portion.

11. The chip bonding method according to claim 1, wherein subsequent to forming the light absorbing film layer on the side of the second substrate portion facing away from the electrode, the chip bonding method further comprises:
placing the display module on a support, wherein the support is on a side of the display module where the light absorption film layer is formed, and the laser beam is capable of passing through the support.

12. The chip bonding method according to claim 11, wherein the support is at least partially transparent.

13. The chip bonding method according to claim 12, wherein the support comprises quartz.

14. The chip bonding method according to claim 12, wherein the irradiating, by using the laser beam, the side of the second substrate portion facing away from the electrode comprises:
generating the laser beam by an infrared laser.

15. The chip bonding method according to claim 1, wherein a material of the light absorbing film layer comprises a photoresist.

16. The chip bonding method according to claim 1, wherein the substrate comprises a glass substrate.

17. The chip bonding method according to claim 1, wherein the irradiating, by using the laser beam, the side of the second substrate portion facing away from the electrode comprises:
causing a part of the laser beam to be absorbed by the light absorbing film layer, and causing another part of the laser beam to pass through the substrate to heat the conductive adhesive film.

\* \* \* \* \*